(12) United States Patent
Ma et al.

(10) Patent No.: US 8,708,644 B2
(45) Date of Patent: Apr. 29, 2014

(54) FIXING DEVICE FOR FAN

(75) Inventors: Xiao-Feng Ma, Shenzhen (CN); Zi-Xuan Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 384 days.

(21) Appl. No.: 13/198,737

(22) Filed: Aug. 5, 2011

(65) Prior Publication Data

US 2013/0028728 A1 Jan. 31, 2013

(30) Foreign Application Priority Data

Jul. 25, 2011 (CN) .......................... 2011 1 0208903

(51) Int. Cl.
*F03D 11/00* (2006.01)
*F01D 5/00* (2006.01)
*F01D 25/04* (2006.01)
*F04D 29/66* (2006.01)

(52) U.S. Cl.
USPC ..................... 415/119; 416/244 R; 415/213.1

(58) Field of Classification Search
USPC .......... 248/560, 604, 637, 658, 607; 312/236; 361/679.48, 694–695; 454/184; 415/119, 182.1, 213.1, 232; 416/244 R
See application file for complete search history.

(56) References Cited

U.S. PATENT DOCUMENTS

| | | | | |
|---|---|---|---|---|
| 7,697,287 | B2 * | 4/2010 | Yin ................................ | 361/695 |
| 7,771,165 | B2 * | 8/2010 | Chen .......................... | 415/213.1 |
| 8,120,906 | B2 * | 2/2012 | Li .............................. | 361/679.58 |
| 8,177,504 | B2 * | 5/2012 | Zhang et al. ................ | 415/213.1 |
| 8,379,387 | B2 * | 2/2013 | Chuang ........................ | 361/695 |
| 2012/0328449 | A1 * | 12/2012 | Xia et al. .................. | 416/244 R |

* cited by examiner

*Primary Examiner* — Edward Look
*Assistant Examiner* — Christopher J Hargitt
(74) *Attorney, Agent, or Firm* — Novak Druce Connolly Bove + Quigg LLP

(57) ABSTRACT

A device for fixing two fans includes a chassis, a limiting member mounted in the chassis, and a blocking member. A receiving space is bounded by the chassis and by the limiting member. The blocking member is sandwiched between the fans, and includes two angled plates which may concertina towards or away from each other as the fans are repositioned to seal the space between the fans.

10 Claims, 4 Drawing Sheets

FIXING DEVICE FOR FAN

BACKGROUND

1. Technical Field

The present disclosure relates to a device for fixing a plurality of fans.

2. Description of Related Art

In electronics, fans may be used to assist in dissipating heat generated by elements mounted on circuit boards. Generally, the fans are fixed in one position in the chassis and cannot be removed. As a result, if the electronic element needs to be relocated, the fans may not dissipate heat so effectively.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
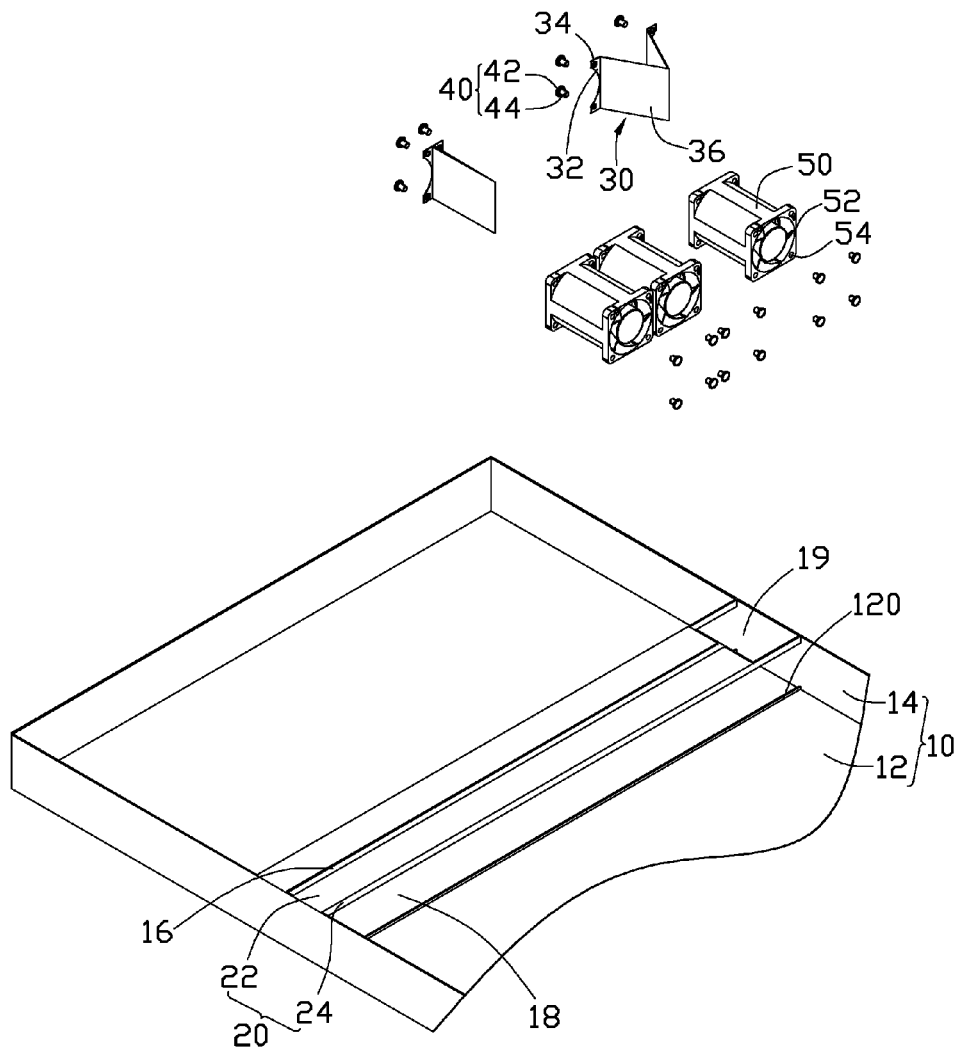
FIG. 1 is an exploded, isometric view of an exemplary embodiment of a fixing device, together with fans.
Figure 2:
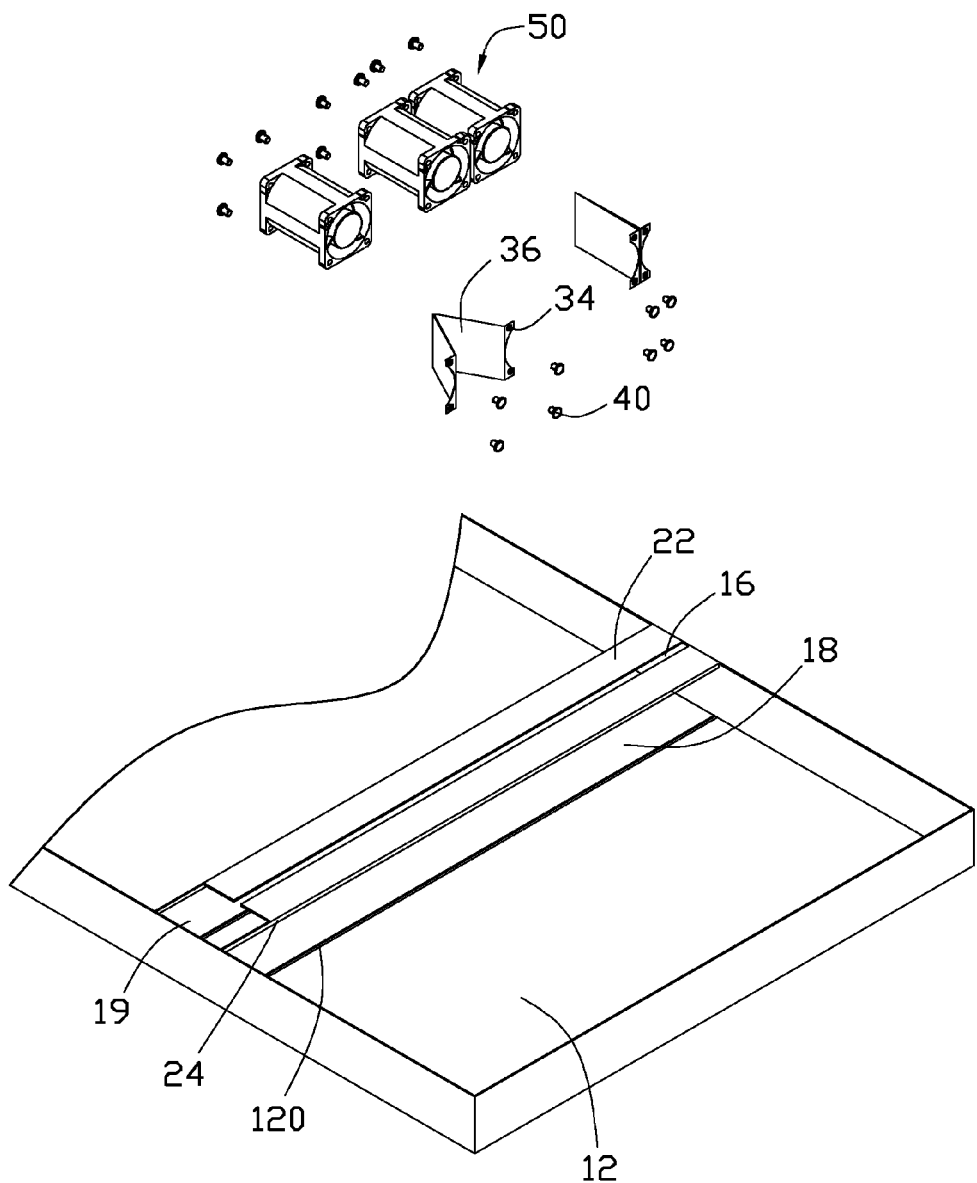
FIG. 2 is similar to FIG. 1, but viewed from another perspective.

Referring to FIGS. 1 and 2, an exemplary embodiment of a fixing device for fixing a plurality of fans 50 includes a chassis 10, a limiting member 20, a plurality of blocking members 30 and a plurality of fasteners 40.

The chassis 10 includes a bottom wall 12 and two sidewalls 14 extending in a substantially perpendicular manner from opposite sides of the bottom wall 12. Two blocking pieces 120 (braces or cross members) substantially perpendicular to the sidewalls 14 extend in a substantially perpendicular manner from the bottom wall 12.

The limiting member 20 is perpendicularly mounted between the sidewalls 14 corresponding to the blocking pieces 120. The limiting member 20 includes a top board 22 and two side boards 24 extending down in a substantially perpendicular manner from opposite sides of the top board 22. A slot 16 substantially perpendicular to the sidewalls 14 is defined in the center of the top board 22. An opening 19 communicating with the slot 16 is defined in an end of the top board 22 adjacent to one of the sidewalls 14. A receiving space 18 communicating with the slot 16 and the opening 19 is bounded by the chassis 10 and by the limiting member 20.

Each blocking member 30 is substantially V-shaped, and includes two plates 36 extending from the vertex. A fixing piece 32 extends outwards from the distal end of each plate 36. Two fixing holes 34 are defined in opposite ends of each fixing piece 32. The blocking member 30 is made of elastic material and is deformable.

Each fastener 40 is made of elastic material, and includes a head 42 and an extension portion 44.

Each fan 50 has an end board 52 at either end. Each end board 52 defines four corner holes 14.

In assembly, a blocking member 30 is mounted between two adjacent fans 50. The fixing pieces 34 are attached to the outer surfaces of the end boards 52 of the adjacent fans 50. The extension portions 44 of the four fasteners 40 extend through the fixing holes 34 of the fixing pieces 32 and engage in the corner holes 54 of the two adjacent fans 50 to sandwich the plates 36 between any two adjacent fans 50.

Figure 3:
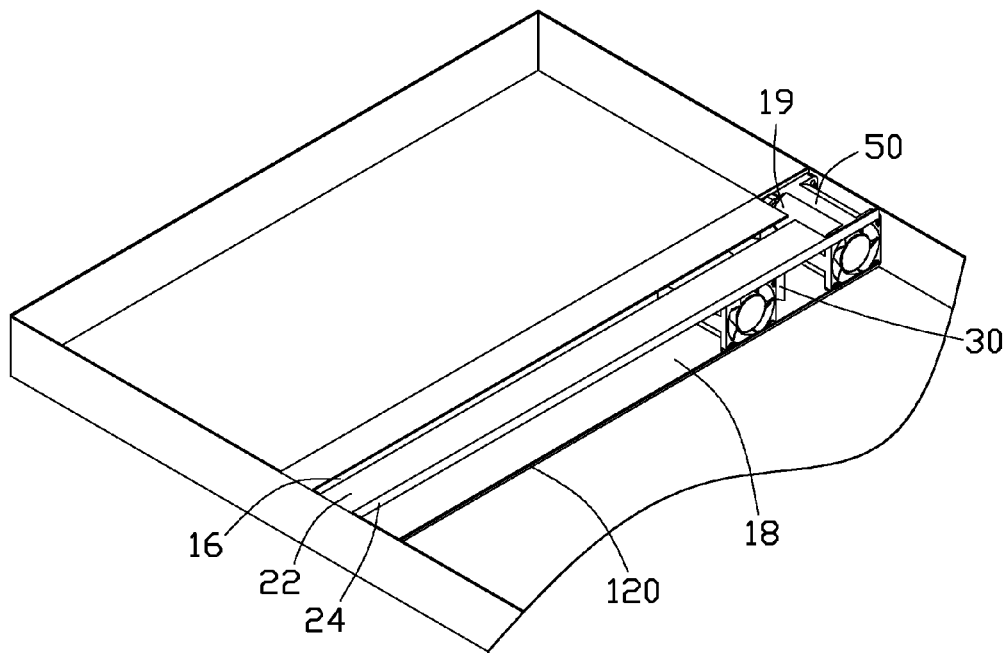
FIG. 3 is a partially assembled, isometric view of FIG. 1.
Figure 4:
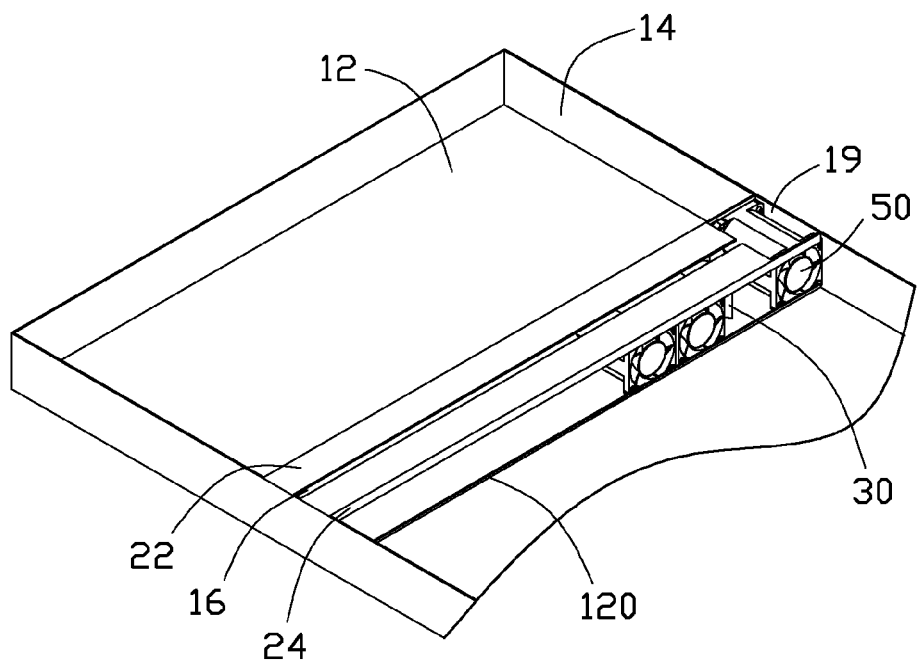
FIG. 4 is an assembled, isometric view of FIG. 1.

Referring to FIGS. 3 and 4, a fan 50 is inserted into the receiving space 18 through the opening 19. The tops and bottoms of the end boards 52 of the fan 50 are contained by the sideboards 24 and the blocking pieces 120, respectively. The next fan 50 is then inserted into the receiving space 18 through the opening 19. The plates 36 of the blocking member 30 connected between the fans 50 are deformed out of a single multi-angle plane first, but than return to one multi-angle plane after the next fan 50 is completely received in the receiving space 18, to fill a space between the two fans 50. The heads 42 resist again the inner surfaces of the sideboards 24 and the inner surfaces of the blocking pieces 120 to position and hold the fans 50 in the receiving space 18, and to absorb vibrations.

Using the slot 16, a tool (not shown) may manipulate the position of a fan 50. The plates 36 of the blocking member 30 between the fans 50 may move together or away from each other, effectively creating a air seal and preventing any entry or exit of air other then through the two adjacent fans 50.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A fixing device for fixing a plurality of fans, the fixing device comprising:
   a chassis;
   a limiting member formed in the chassis, and bounding a receiving space together with the chassis; and
   a blocking member for being sandwiched between adjacent two of the plurality of fans, the blocking member comprising two angled plates, first ends of the plates connected to each other, and second ends of the plates connected to the two fans, respectively;
   wherein the plates are operable to extend toward or away from each other in response to the two fans moving toward or away from each other, to fill a space between the fans.

2. The fixing device of claim 1, wherein the chassis comprises a bottom wall and two sidewalls extending up from opposite sides of the bottom wall, the limiting member is mounted between the sidewalls, and comprises a top board opposite to the bottom wall.

3. The fixing device of claim 2, wherein the top board defines a slot perpendicular to the sidewalls for manipulate the position of the fans.

4. The fixing device of claim 3, wherein the top board defines an opening adjacent to one of the sidewalls, through which the fans enter the receiving space.

5. The fixing device of claim 2, wherein the limiting member further comprises two side boards extending down from opposite sides of the top board, the side boards sandwich tops of the fans.

6. The fixing device of claim 5, wherein two blocking pieces substantially perpendicular to the sidewalls extend in a substantially perpendicular manner from the bottom wall to sandwich bottoms of the fans.

7. The fixing device of claim 6, further comprising a plurality of fasteners, wherein each fastener comprises a head and an extension portion extending from a first side of the head, wherein the extension portions extend through the fixing pieces and engage in the fans, the second sides of the heads opposite to the first sides resist against inner surfaces of the blocking pieces and the side boards, correspondingly.

8. The fixing device of claim 2, wherein the plates are perpendicular to the bottom wall.

9. The fixing device of claim 1, wherein the blocking member is substantially V-shaped, a fixing piece extends from the second end of each plate away from the other plate, to be fixed to the corresponding fan.

10. The fixing device of claim 1, wherein the blocking member is made of elastic material, and is operable to be twisted.

* * * * *